(12) United States Patent
Graef et al.

(10) Patent No.: US 8,390,203 B2
(45) Date of Patent: Mar. 5, 2013

(54) METHOD FOR THE PRODUCTION OF A CERAMIC SPIRAL PULSE GENERATOR AND CERAMIC SPIRAL PULSE GENERATOR

(75) Inventors: Juergen Graef, Augsburg (DE); Steffen Walter, Oberpframmern (DE); Andreas Kloss, Neubiberg (DE)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 621 days.

(21) Appl. No.: 12/602,779

(22) PCT Filed: May 26, 2008

(86) PCT No.: PCT/EP2008/056424
§ 371 (c)(1),
(2), (4) Date: Dec. 3, 2009

(87) PCT Pub. No.: WO2008/148657
PCT Pub. Date: Dec. 11, 2008

(65) Prior Publication Data
US 2010/0176727 A1    Jul. 15, 2010

(30) Foreign Application Priority Data
Jun. 6, 2007   (DE) .......................... 10 2007 026 306

(51) Int. Cl.
*H01J 17/02* (2006.01)
(52) U.S. Cl. .................. 315/56; 315/71; 315/72; 315/58
(58) Field of Classification Search .................... 315/39, 315/58, 63, 72–74, 47, 104, 106, 263, 289, 315/290, DIG. 5, DIG. 7, 56, 71; 333/156, 333/161
See application file for complete search history.

(56) References Cited

U.S. PATENT DOCUMENTS

| | | | |
|---|---|---|---|
| 4,325,004 A * | 4/1982 | Proud et al. ...................... 315/45 |
| 4,353,012 A | 10/1982 | Fallier, Jr. et al. |
| 4,379,982 A * | 4/1983 | Proud ............................. 315/73 |
| 4,629,945 A * | 12/1986 | Fallier et al. .................. 315/207 |
| 4,721,888 A * | 1/1988 | Proud et al. ...................... 315/60 |
| 4,724,362 A * | 2/1988 | Lester ........................... 315/289 |
| 4,985,103 A | 1/1991 | Kouno et al. |
| 5,567,995 A * | 10/1996 | O'Loughlin et al. ......... 307/109 |
| 7,026,891 B2 * | 4/2006 | Mazzochette ................. 333/161 |
| 2003/0118481 A1 | 6/2003 | Briscoe et al. |
| 2003/0128082 A1 | 7/2003 | Mazzochette |

FOREIGN PATENT DOCUMENTS

| | | |
|---|---|---|
| JP | 57122511 A | 7/1982 |
| JP | 01096911 U | 6/1989 |
| JP | 2159711 A | 6/1990 |
| JP | 2005033579 A | 2/2005 |

OTHER PUBLICATIONS

English language abstract for JP 01096911 U, Apr. 14, 1989.
English language abstract for JP 2005033579 A, Feb. 3, 2005.
International Search Report of PCT/EP2008/056424 mailed Sep. 19, 2008.
David L. Wilcox, Sr. et al, "The Multilayer Ceramic Integrated Circuit (MCIC) Technology: Opportunities and Challenges", 1997 International Symposium on Microelectronics, pp. 17-23.

* cited by examiner

*Primary Examiner* — Vibol Tan

(57) ABSTRACT

A method for producing a ceramic spiral pulse generator is provided. The method may include providing a film composite comprising at least one ceramic green film and at least one metal layer; winding the film composite to form a spirally wound winding; laminating the winding; and sintering the laminated winding so as to create a spiral pulse generator.

17 Claims, 7 Drawing Sheets

METHOD FOR THE PRODUCTION OF A CERAMIC SPIRAL PULSE GENERATOR AND CERAMIC SPIRAL PULSE GENERATOR

RELATED APPLICATIONS

The present application is a national stage entry according to 35 U.S.C. §371 of PCT application No.: PCT/EP2008/056424 filed on May 26, 2008, which claims priority from German application No.: 10 2007 026 306.8 filed on Jun. 6, 2007.

BACKGROUND

The spiral pulse generator is a component which combines properties of a capacitor with those of a waveguide in order to generate ignition pulses with a voltage of at least 1.5 kV. By the production method according to the invention, it is possible to produce spiral pulse generators which are thermally stable up to about 500° C., 700° C. or 1000° C. depending on the material. The spiral pulse generator is configured as an LTCC or HTCC component, and consists essentially of ceramic films and metallic conductive paste or a metal foil, which are wound to form a coil and then laminated and sintered.

Spiral pulse generators can be used as ignition transformers for discharge lamps. For this application, it is above all the ignition voltage level to be achieved and the high thermal stability which are important.

The production of a spiral pulse generator as described is carried out either in LTCC (low temperature cofired ceramic) technology or in a refined method. LTCC technology is suitable for the production of monolithic ceramic multilayer systems with integrated passive components (see for example D. L. Wilcox, Proc. 1997 ISHM Philadelphia, pp. 17-23). This technology is suitable in particular for ceramic components into which very highly electrically conductive material such as gold, copper, silver or aluminum is intended to be integrated. The essential method steps of LTCC technology are:
- producing a ceramic green film, containing organic binder, which may furthermore include a glass ceramic.
- optionally producing openings in the ceramic green film, which are intended for contacting.
- filling the openings with electrically conductive material.
- printing electrical conductor structures on the ceramic green film.
- stacking and laminating the ceramic green films to form a composite.
- sintering the composite to form a body with a monolithic multilayer structure.

The compaction of the ceramic material in the sintering process leads to a volume reduction of 10%-20%.

The LTCC method has previously been used only for components with a planar structure such as printed circuit boards, ceramic capacitors etc. However, since for example a transformer has inductive properties, it is wound. Wound components cannot be produced by the conventional methods for LTCC ceramic bodies.

SUMMARY

Various embodiments provide a production method, by which spiral pulse generators can be produced in a design similar to LTCC. Various embodiments further provide a spiral pulse generator which is produced by aforementioned methods.

For production, two ceramic "green films" are printed on using conductive metal paste or coated with a metal foil and subsequently wound offset to form a spiral, and finally pressed isostatically to form a shaped body. As an alternative, a ceramic slurry may be applied onto a metal foil, the slurry/foil composite dried and then wound and laminated. The subsequent co-sintering of the metal paste or foil and the ceramic material is carried out in air in the temperature ranges of 500° C.-600° C., 800° C.-900° C., 1250° C.-1450° C., depending on the method variant. This processing permits a working range of the spiral pulse generator up to a thermal stress of 500° C., 700° C., 1000° C., depending on the variant. The spiral pulse generator can therefore be fitted in the direct vicinity of the discharge vessel in the outer bulb, but also in the cap or in the immediate vicinity of the lamp.

It is advantageous to use ceramic material systems with a high dielectric constant or with a high permeability, or a mixture of the two, for the production of the ceramic green film or the ceramic slurry.

It is also advantageous to use an anodized aluminum foil, a molybdenum foil or a foil made of one or a mixture of the metals copper, nickel, steel, zinc as the metal foil.

It is also advantageous, in a production method which uses a metal foil, to carry out the winding of the film composite and the lamination of the winding in a single process step. The winding and lamination of the film composite may in this case be carried out by means of heated rollers, which generate a defined application pressure with a defined tension of the film.

The sintering of the laminated winding is preferably carried out at 500° C.-600° C. in the case of an aluminum foil as the metal foil, at 800° C.-900° C. in the case of a metallic paste or a foil made of one or a mixture of the metals copper, nickel, steel, zinc, and at 1250° C.-1450° C. in the case of a molybdenum foil.

The printing on the ceramic green film with a metallic paste is preferably carried out by a drawing method with a squeegee with a gap width of 10 µm-120 µm at a drawing speed of between 0.5 cm/s and 2.0 cm/s.

The lamination of the winding, in the case of a metallic conductive paste, is preferably carried out by an isostatic pressing process with bath temperatures of from 30° C. to 80° C. and with a pressing time of between 5 and 15 minutes.

Other advantageous refinements and configurations of the spiral pulse generator according to the invention, and the production method, may be found in the other dependent claims and the following description.

BRIEF DESCRIPTION OF THE DRAWING(S)

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows the basic structure of a spiral pulse generator.

FIGS. 2a-c show the section through a film layer and the further processing according to the first embodiment.

FIGS. 3a-b show the production of a film winding.

FIGS. 4a-b show the separation of the winding after the lamination.

Figure 9A:
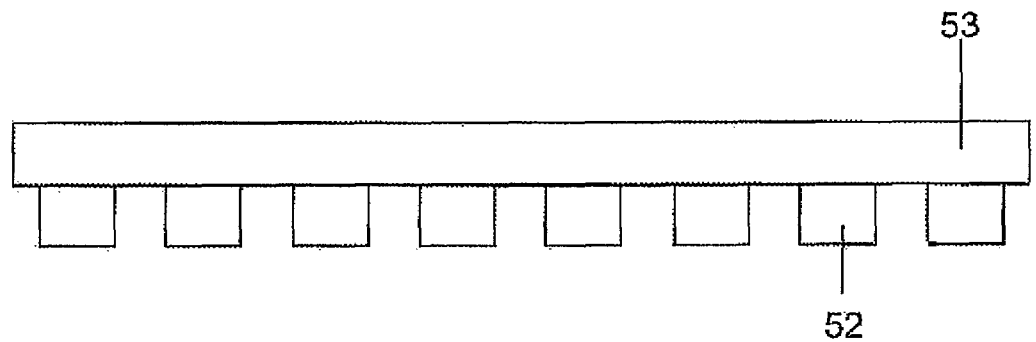
Figure 9B:
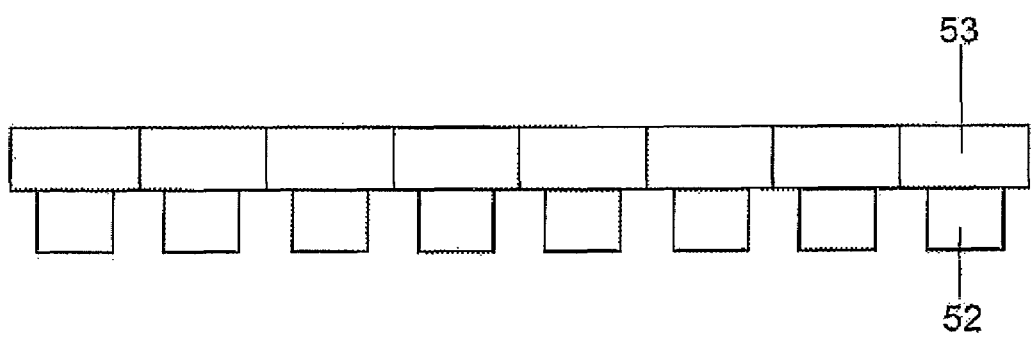

FIGS. 9*a*-*b* show the section through a film layer and the further processing according to the second embodiment and a first refinement.

Figure 10:
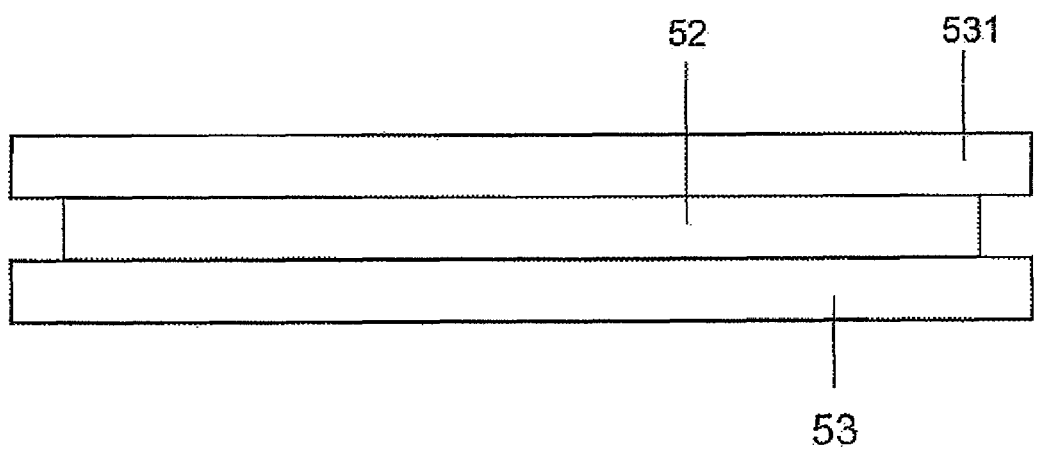

FIG. 10 shows the section through a film layer according to the second embodiment and a second refinement.

DETAILED DESCRIPTION

The following detailed description refers to the accompanying drawings that show, by way of illustration, specific details and embodiments in which the invention may be practiced.

The method according to the invention may be carried out in two different variants. The first variant describes a production method which is based on the conventional LTCC method. The second variant is a refined method in which the conductive paste is replaced by a conductive metal foil.

First Variant of the Method According to the Invention

Like the production of a conventional LTCC substrate, the production of a ceramic spiral pulse generator begins with the production of the ceramic green films (FIG. 2). The slurry is applied onto a plastic carrier film 51, for example by squeegee application, and then dried. The plastic carrier film is then rolled onto a flat surface, for example a glass plate, with a thin water film. The water film fixes the film on the glass plate. The slurry contains the ceramic per se, an organic binder and optionally a glass solder.

As an alternative, film casting according to the doctor blade method may be employed in order to produce the ceramic green film. In this case, a castable slurry is produced as described above from the ceramic material and the glass solder by adding solvents and dispersants, and it is then cast with the aid of a knife (so-called doctor blade) with a defined thickness onto a revolving film. After drying, the green film which is produced is plastic and readily handleable. A higher content of binders and plasticizers is necessary for the film casting process. As a rule of thumb, the ceramic particle cavities must be filled completely by these additives in order to obtain handleable green films.

The ceramic may either be a capacitively acting ceramic having a high $\in_r$, or an inductively acting ceramic having a high $\mu_r$, or a mixture of the two. All ceramic material systems from which ceramic green films can be cast by means of a slurry are suitable for the production of spiral pulse generators. The capacitively acting ceramic material systems (non-metallic inorganic systems) have in the basic state a dielectric constant $\in_r$ of between 5 and 20,000. The inductively acting material systems have in the basic state permeabilities $\mu_r$ of between 20 and 6000.

The material systems preferably used for capacitively acting ceramics are indicated in the following table:

| Material | Chemical formula | Dielectric constant |
|---|---|---|
| Ceramic substrate of LTCC technology | $BaSrTiO_3$, $BaNd_2TiO_4O_{12}$, $BaO$-$Re_2O_3$-$TiO_2$ (Re = La, Sm, Nd, Eu) | 3-10,000 |
| Barium titanate | $BaTiO_3$ | 10-20,000 |
| Barium zirconate-titanate | $BaZrTiO_3$ | ~20,000 |
| Lead zirconate-titanate | $PbrTiO_3$ | ~2000 |
| PZT (soft and hard) with additives | $ABO_3$ (A = La, Ag, B = Nb) | ~9000 |
| Lead-magnesium niobate (PMN) | $Pb_3MgNb_2O_9$ | ~20,000 |
| Lead-zinc niobate (PZM) | $Pb_3ZnNb_2O_9$ | ~20,000 |
| Potassium-sodium niobates (KNN) | $(K, Na)NbO_3$ | ~1000 |
| Bismuth-based perovskites | $BiScO_3$—$PbTiO_3$ | ~1000 |
| Tungsten bronzes | $Na_xWO_3$ | ~1000 |

The material systems preferably used for inductively acting ceramics are indicated in the following table:

| Ceramic ferrite | Permeability $\mu_r$ |
|---|---|
| Ba hexaferrite | 20-100 |
| NiZnCu ferrite | 100-500 |
| MnZn ferrite | 200-6000 |

For production of the green films, the ceramic may contain one or more of the material systems mentioned above. The ceramic may also contain any desired mixtures of the aforementioned material systems.

Figure 1:
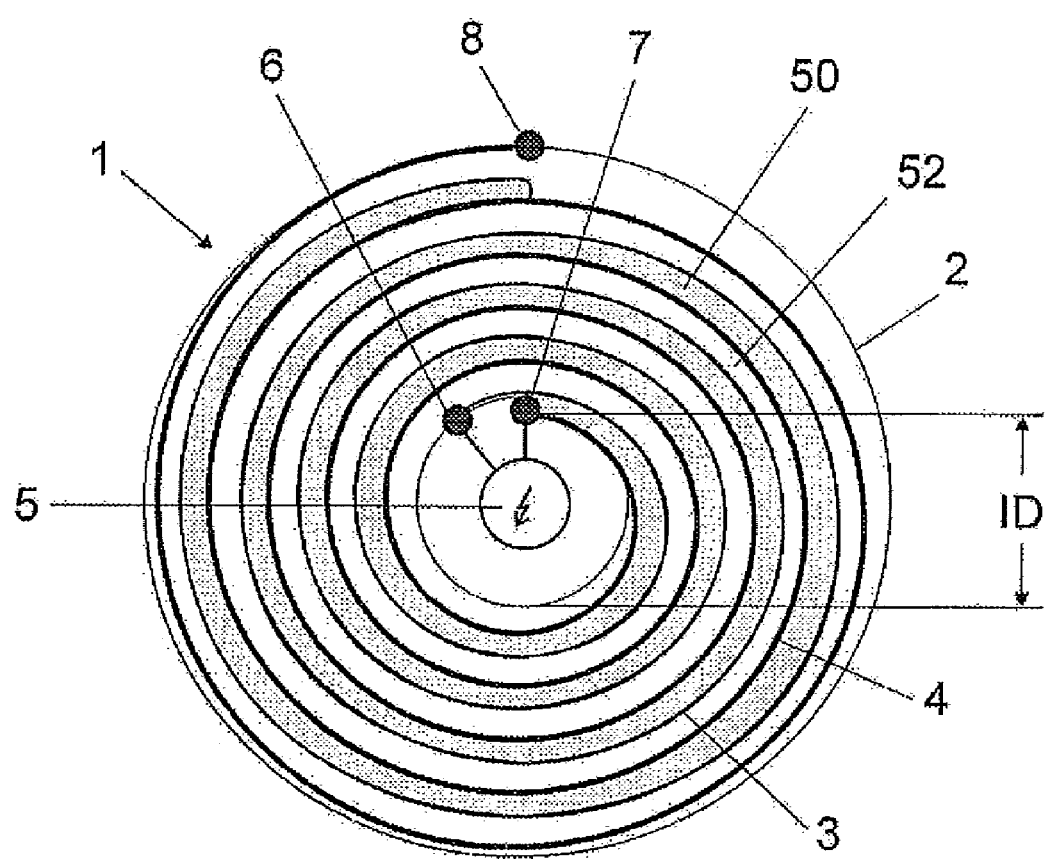
Figure 2A:
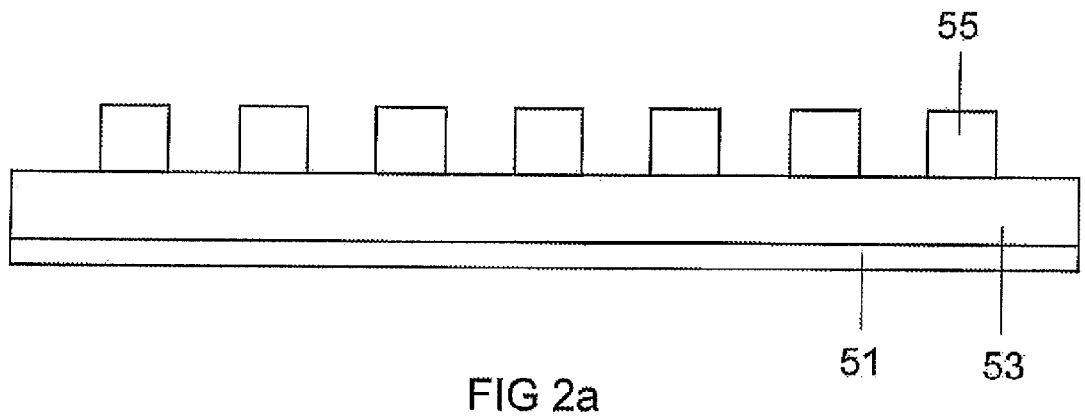
Figure 2B:
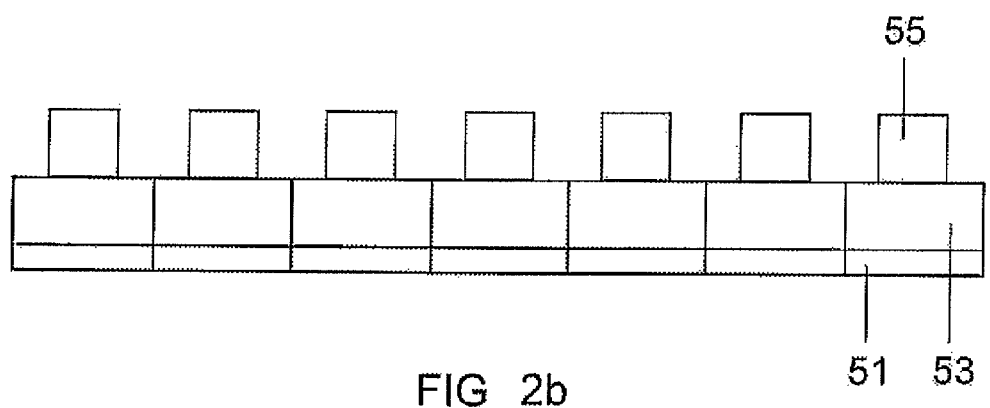

After production of the ceramic green film 53, it is printed on with metallic conductive paste in strips 55 with a width of 3 mm-25 mm, as shown in FIG. 2*a*. The metallization 55 may be carried out by all conventional methods for processing paste-like compounds, for example by means of screen printing methods or by means of a specially shaped squeegee. For the production of spiral pulse generators, application by means of a squeegee is most efficient. The squeegee is pulled with a gap width of 10μ-120μ so as to apply the conductive paste 55. The pulling speed in this case is about between 0.5 cm/s and 2.0 cm/s.

After application of the conductor tracks 55, they are dried at from 60° C. to 80° C. The drying time is between 5 min and 20 min. The conductor tracks may also be dried at room temperature. The drying time is then 1-3 days.

After drying, the arrangement is cut into strips with the desired width. These strips, represented in FIG. 2*b*, may also be provided with recesses if so required. These are produced particularly simply by stamping. Other methods for structuring ceramic green films, for example photolithography or the production of openings with the aid of laser radiation, may likewise be used here.

Figure 2C:
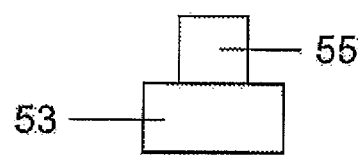

The green film 53 with the applied conductor tracks 55 is now removed from the carrier film 51, as shown in FIG. 2*c*.

Figure 3A:
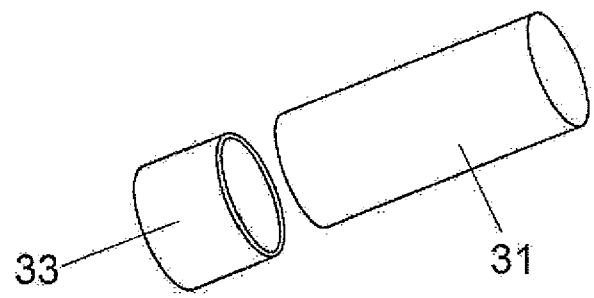
Figure 3B:
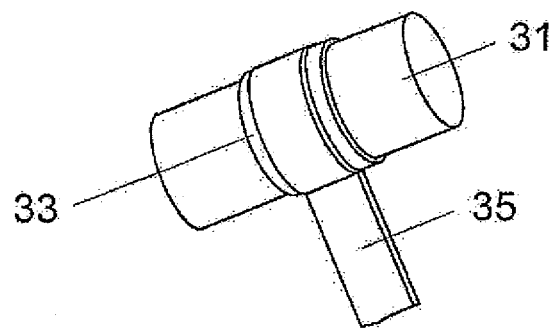

The film strips are wound on a plastic core. The plastic core consists of a plastic sleeve 33, which is fitted onto a plastic mandrel 31 (FIG. 3*a*). Two film strips 35, placed offset on one another, are now wound onto the sleeve and for example fixed with some water (FIG. 3*b*). In order to protect the ceramic green films 35, a rubber pad coated with release agent is wound around the arrangement. The release agent may for example be carbon. The entire arrangement is now welded into a film.

The film welding is necessary for the lamination process which then takes place. For lamination, the welded green film winding is subjected to an isostatic pressing process. The pressing times lie between 5 and 15 minutes, and the bath temperature between 30° C. and 80° C.

Figure 4A:
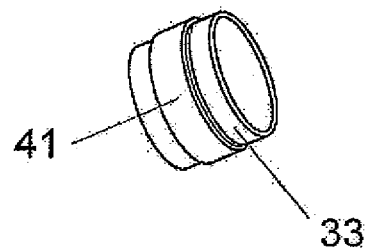

After the lamination process, the sleeve may be removed from the core (FIG. 4a). Owing to the isostatic pressing, the laminated winding 41 has become strong enough for the plastic sleeve 33 to be separated from the winding 41 without thereby damaging the shaped body.

The winding 41 is subsequently co-sintered at temperatures of between 600° C. and 900° C. This process is again equivalent to the normal LTCC: production process. Here again, the sintering gives rise to compaction of the material and therefore a reduction of the volume by between 10% and 20%.

A spiral pulse generator produced in such a way allows use for the ignition of gas discharge lamps for temperatures of up to about 700° with an ignition voltage of more than 1.5 kV.

Since the LTCC method is suitable for integration of passive components, a charging resistor may likewise be co-integrated into the spiral pulse generator. This is necessary for operation of the spiral pulse generator. The charging resistor is introduced by means of the usual method for LTCC.

Second Variant of the Method According to the Invention

The second variant of the method according to the invention differs in a few steps from the first variant. Only the steps and processes which differ from the first variant will be explained below.

The second variant of the method according to the invention is a refinement of the first variant, and is suitable for machine processing. The second variant is also advantageous over the first variant in terms of cost, since more favorable materials are used.

In the second variant of the method according to the invention, the conductor structure consists of a metal foil 52. This has two advantages over the first variant. In the second variant, the metal foil 52 is partly also used simultaneously as a carrier foil, and after lamination supports the ceramic green film 53 which is mechanically very difficult to process owing to its thickness (40µ-60µ) (FIG. 9a). Owing to the metal used (preferably aluminum or molybdenum), the metal foils used for the method are much more economical than conductive pastes, which are predominantly made of noble metals.

Here again ceramic green films 53 are produced in the first working step, although compared with the first method they contain a lower-melting glass solder (in the case of aluminum foil) or a higher-melting glass solder (in the case of molybdenum foil). In other regards, the same material systems and mixtures thereof may be used as described in the first variant of the method. This process can and should take place continuously. Once the ceramic green film 53 has been produced on a plastic carrier, in the second step it is laminated onto the metal foil(s) 52 in a further continuous process. The metal foil is preferably an anodized aluminum foil or a molybdenum foil. The anodizing ($Al_2O_3$) leads to excellent adhesion between the ceramic green film and the aluminum foil. The molybdenum foil offers the advantage of a higher thermal loading capacity, since the spiral pulse generator is sintered at 1250° C.-1450° C. The lamination may be carried out here by rolling with heated rollers and a corresponding application pressure.

After the lamination, the film composite may be cut to the desired width as represented in FIG. 9b. It is however also possible to use a ceramic green film and a metal foil with the desired width from the start.

In a second refinement, the metal film 52 is coated on both sides with a ceramic green film 53, 531 as represented in FIG. 10. The ceramic green films may have different properties; for example, one film 53 may have a high permittivity and the other film a high permeability. During winding, a double layer structure which has the properties of both films is obtained between the metal layers.

As soon as the lamination process has been completed, the metal foil provides the supporting strength of the composite. The mechanical stability of the composite is sufficient for it to be machine-processable thereafter.

The film composite is now preferably wound by a machine. For winding, two of the coated bands are placed offset on one another and wound to form a spiral pulse generator. After winding, the still green spiral pulse generator is laminated. The lamination may, however, also take place directly during winding. This, naturally, obviates the previous lamination process. Preferably, here again heated rollers with a defined application pressure are used. During winding, a defined tension of the film composite is naturally likewise maintained. These two parameters, together with the roller temperature, ensure consistent and high-quality lamination of the spiral pulse generator. The winding may be carried out by means of a sleeve 33, although it is also possible to wind the spiral pulse generator without a sleeve.

The wound generator may then be sintered. When using an aluminum foil, the sintering is carried out at a lower temperature of from 500° C. to 600° C. This is necessary in order to remain far below the melting temperature of the metal foil. A particularly strong metal/ceramic composite is obtained owing to the anodized surface of the aluminum band ($Al_2O_3$). In the case of a metal foil made of one or a mixture of the metals copper, nickel, steel, zinc, the wound generator is sintered at a temperature of 800° C.-900° C. If molybdenum foil is used, then the sintering is carried out at a temperature of 1250° C.-1450° C. in a protective gas atmosphere (Ar, $N_2$, forming gas).

By the second variant of the method according to the invention, spiral pulse generators can be manufactured economically in large batches. Owing to the reduction of the sintering temperatures, the replacement of noble metal pastes by economical commercially available metal foils and the machine processing, spiral pulse generators can enter fields of application from which they have previously been prevented for cost reasons.

Third Variant of the Method According to the Invention

The third variant of the method according to the invention differs only insubstantially from the second variant. Only the method steps which differ from the second variant will therefore be explained.

In the third variant of the method according to the invention, a ceramic green film is no longer produced and then processed further. Instead, the green film production is integrated directly into the manufacturing process of the spiral pulse generator. This obviates the first step of producing the ceramic green films; this is combined with the second step. Instead of laminating the previously produced green films onto the metal foil, the metal foil is coated directly with the ceramic slurry and then dried. This obviates an elaborate working step and delicate handling of the ceramic green films. This process may also be configured as a continuous process.

The coating may be carried out by means of a tape-cast method or with a squeegee. The coating is preferably carried out by means of an immersion method. In this case, the metal film is fed through a bath which contains the ceramic slurry. A layer of the ceramic slurry is thereby formed on the surface of the metal foil. Since the metal foil is completely encapsulated by the ceramic slurry, the layer thickness only needs to be half the desired layer thickness since two ceramic layers will respectively lie on one another between the metal foils when two coated metal foils are wound together to form a spiral pulse generator.

In order to be able to adjust the capacitive and inductive properties of the spiral pulse generator as freely as possible, a multilayer structure of the ceramic layer may also be desirable. To this end the metal foil is pulled several times in succession through a bath of a ceramic slurry, in which case ceramic slurries may have different properties. It is, for example, advantageous for an inductive layer which is electrically conductive to be enclosed by two highly insulating capacitive layers. This will prevent leakage currents in a finally wound and charged spiral pulse generator.

To this end the metal foil is first pulled through a bath of capacitively acting slurry, then through a bath of inductively acting slurry and finally once more through a bath of capacitively acting slurry. The bath must be configured so that the deposited layer thicknesses together give the desired layer thickness. In the simplest case, the deposited layer thickness is one third of the layer thickness desired for a film. It is, however, also conceivable for the capacitively acting layers and the inductively acting layers to have different thicknesses.

Since the layer thicknesses of two films are added together, it is also conceivable for such an exemplary three-layer structure to be created by means of the layers of the two metal foils. In this case, for example, a capacitive layer and an inductive layer are applied on one metal foil. A capacitive layer is applied on the other foil. When the foils are wound together, this gives the desired three-layer structure of capacitive-inductive-capacitive layers. The total layer thickness on the first foil may be two times as thick as the layer on the second foil, so that a uniform layer thickness distribution is obtained overall. The layer thicknesses may, however, also be varied according to requirements.

The deposited layer thickness can be adjusted via the slurry composition, its viscosity and its temperature.

A typical slurry composition for the single-layer coating of a metal foil is made up as follows:

| Quantity | Material |
| --- | --- |
| 100 g | Ceramic powders (dielectric, ferrite) |
| 20 g-40 g | Solvents (ethanol, toluene, water, methyl ethyl ketone) |
| 2 g-4 g | Dispersant (for example KD 1-4, ICI) |
| 30 g-45 g | Binder solution (polyvinyl butyral (PVB), acrylate binder, epoxy-based binder, polypropylene carbonate, methyl cellulose, polyvinyl alcohol (PVA)) |
| 45 g | |
| 2 g-5 g | Plasticizer (phthalates, for example benzyl butyl phthalate) |

The viscosity range of the slurry should lie between 10 mPa*s and 900 mPa*s, with a temperature of 20° C.-40° C.

The average particle size of the ceramic powder advantageously has a value of between 500 nm and 10 μm.

In order to improve the adhesion of the slurry on the metal film, it may initially be provided with an adhesion-promoting layer. In the case of an aluminum foil, for example, an $Al_2O_3$ layer which adheres very well to the ceramic slurry may be applied.

After drying, the metal/green film composite is wound and then laminated as in the second alternative embodiment, or laminated during winding. The same requirements apply as in the second variant. The further processing does not differ from the second variant.

Application Variants

Figure 7:
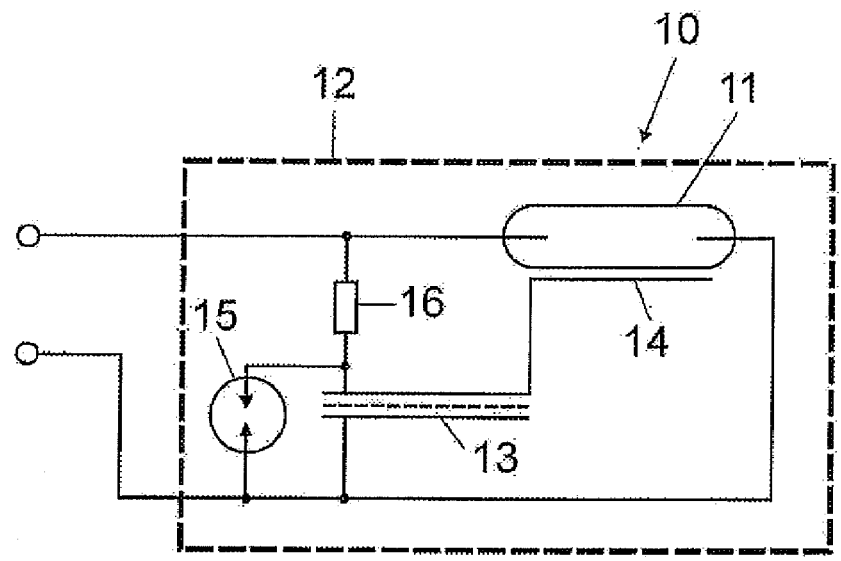
FIG. 7 shows the basic structure of a high-pressure sodium lamp with a spiral pulse generator in the outer bulb.

FIG. 7 shows the basic structure of a high-pressure sodium lamp 10 with a ceramic discharge vessel 11 and an outer bulb 12 with a spiral pulse generator 13 integrated in it, an ignition electrode 14 being fitted externally on the ceramic discharge vessel 11. The spiral pulse generator 13 is fitted with the spark gap 15 and the charging resistor 16 in the outer bulb.

Figure 8:
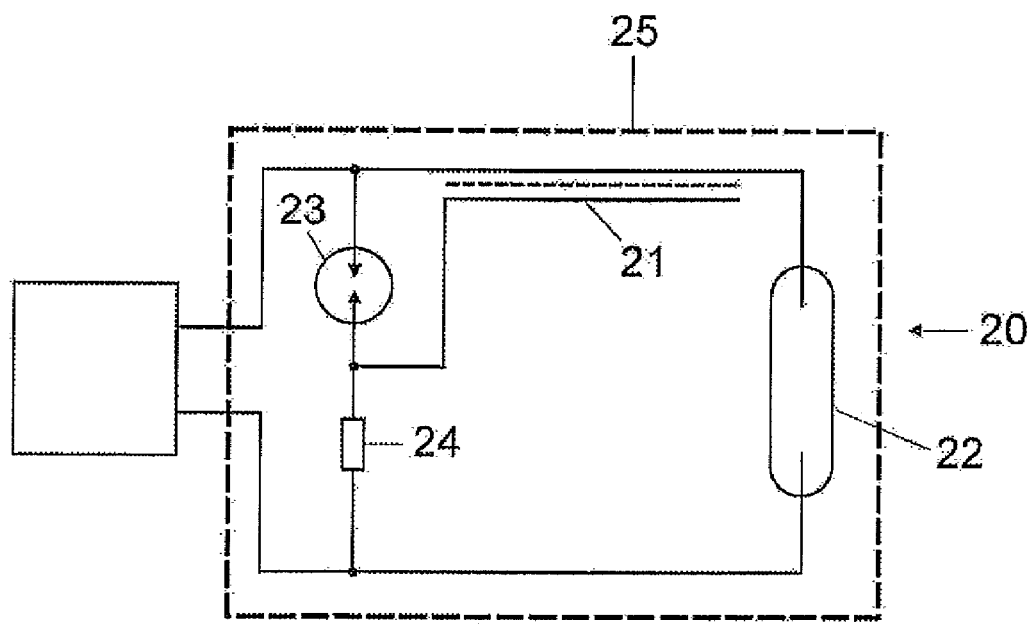
FIG. 8 shows the basic structure of a metal halide lamp with a spiral pulse generator in the outer bulb.

FIG. 8 shows the basic structure of a metal halide lamp 20 with an integrated spiral pulse generator 21, without an ignition electrode being fitted externally on the discharge vessel 22 which may be made of quartz glass or ceramic. The spiral pulse generator 21 is fitted with the spark gap 23 and the charging resistor 24 in the outer bulb 25.

Figure 4B:
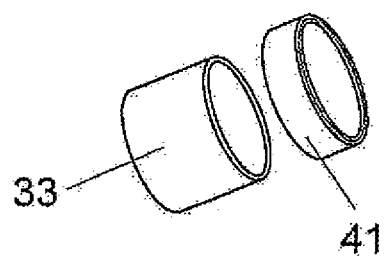
Figure 5:
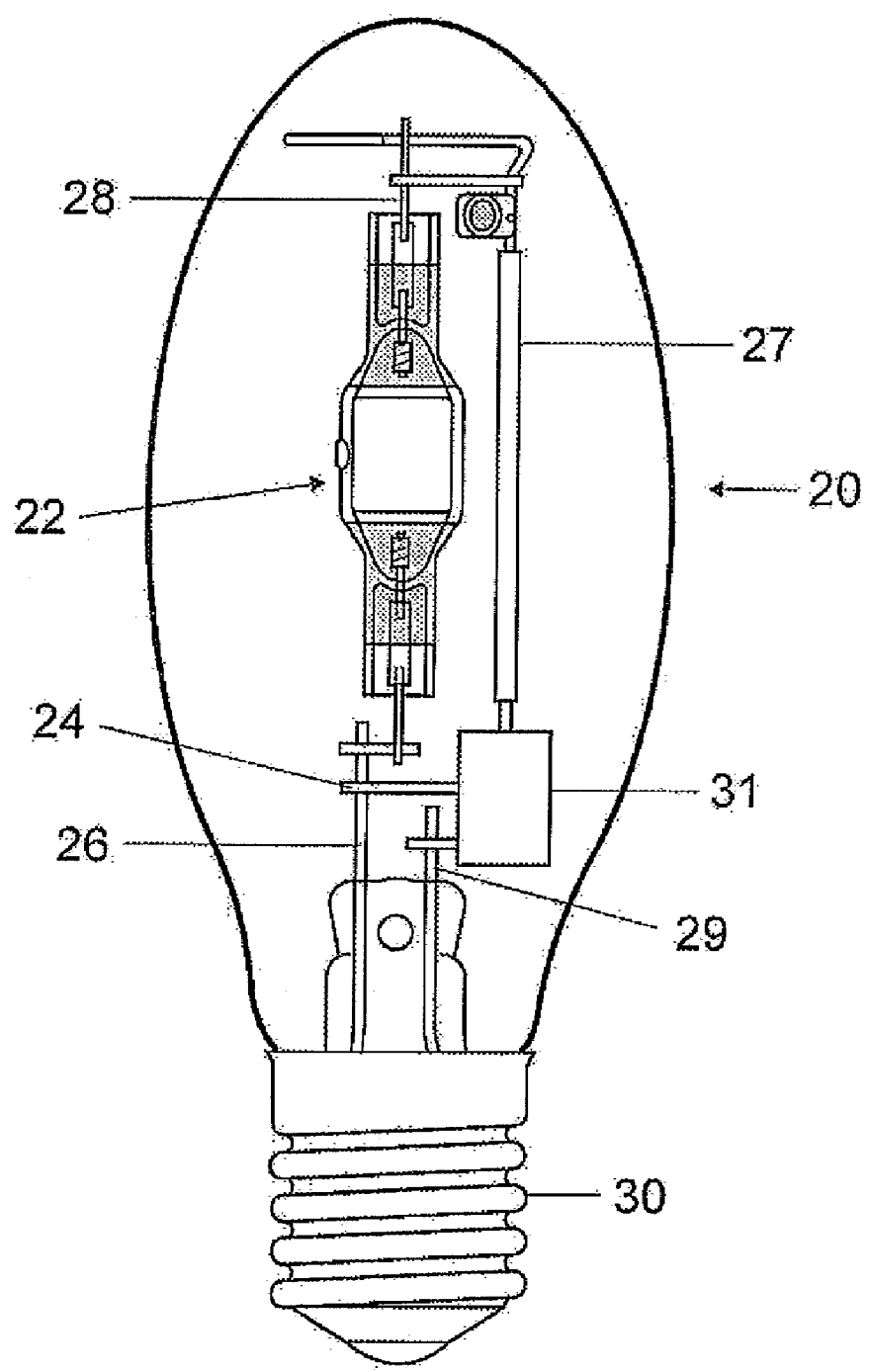
FIG. 5 shows a metal halide lamp with a spiral pulse generator in the outer bulb.

FIG. 5 shows a metal halide lamp 20 having a discharge vessel 22, which is held by two supply leads 26, 27 in an outer bulb. The first supply lead 26 is a shortly angled-off wire. The second 27 is essentially a rod, which leads to the feed-through 28 on the opposite side from the cap. Between the supply lead 29 from the cap 30 and the rod 27, an ignition unit 31 is arranged which contains the spiral pulse generator, the spark gap and the charging resistor, as indicated in FIG. 4.

Figure 6:
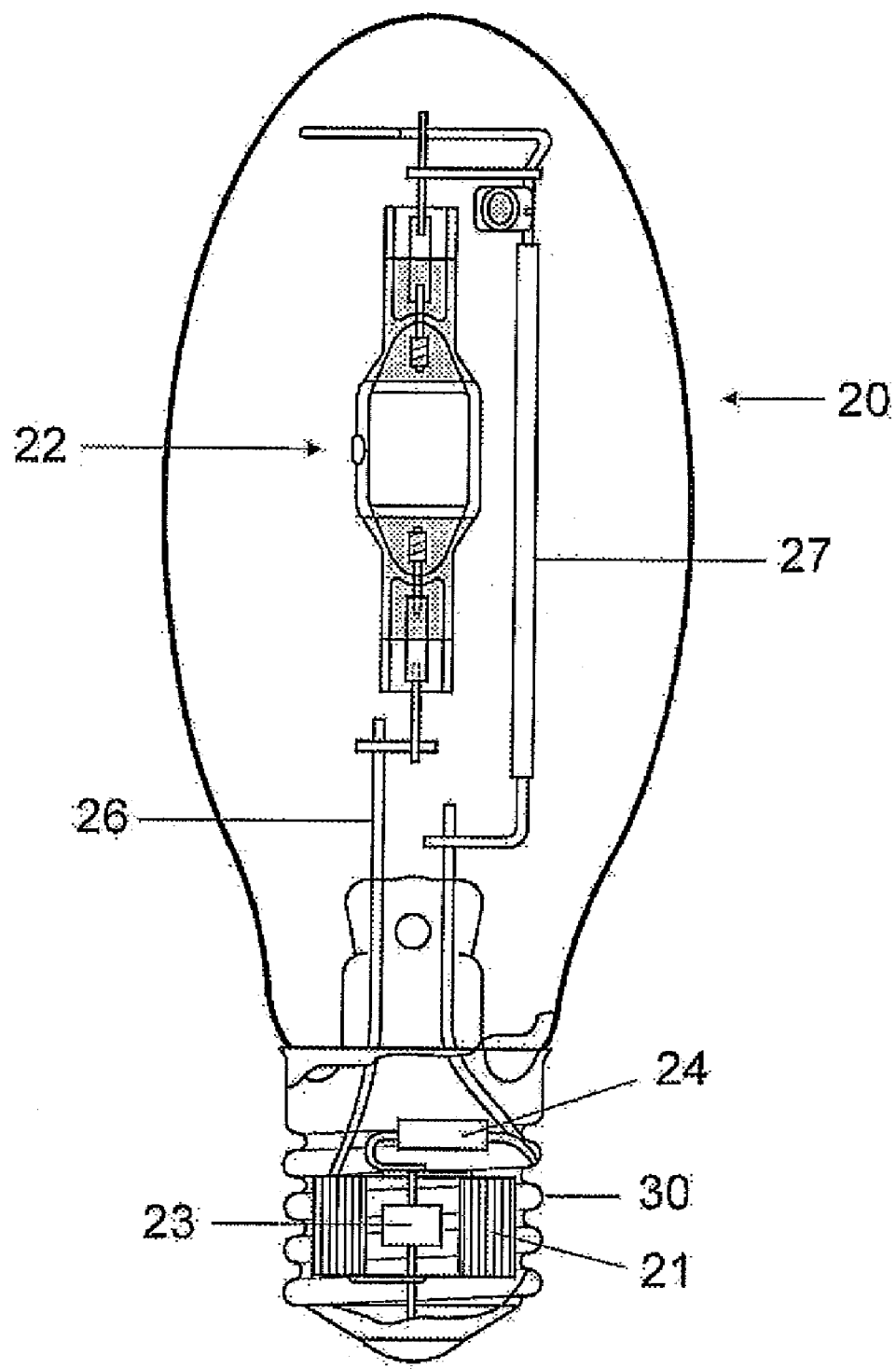
FIG. 6 shows a metal halide lamp with a spiral pulse generator in the cap.

FIG. 6 shows a metal halide lamp 20 similarly as FIG. 5, having a discharge vessel 22 which is held in an outer bulb 25 by two supply leads 26, 27. The first supply lead 26 is a shortly angled-off wire. The second 27 is essentially a rod, which leads to the feed-through 28 on the opposite side from the cap. Here the ignition unit is arranged in the cap 30, and specifically both the spiral pulse generator 21 and the spark gap 23 and the charging resistor 24.

This technique may also be employed for electrodeless lamps, in which case the spiral pulse generator may be used as an ignition aid.

Further applications of this compact high-voltage pulse generator may be found in the ignition of other apparatus. Its use is advantageous above all for so-called magic spheres, for the generation of X-ray pulses and for the generation of electron-beam pulses. It may also be used in motor vehicles as a replacement for the conventional ignition coils.

Turns numbers n of up to 500 are used, so that the output voltage reaches the order of 100 kV. Specifically, the output voltage UA is given as a function of the charging voltage UL by UA=2×n×UL×η, the efficiency η being given by η=(AD−ID)/AD.

The invention offers particular advantages in conjunction with high-pressure discharge lamps for automobile headlamps which are filled with xenon at a high pressure of preferably at least 3 bar and metal halides. These are particularly difficult to ignite since the ignition voltage is more than 10 kV owing to the high xenon pressure. Currently, the components of the ignition unit are fitted in the cap. A spiral pulse generator having an integrated charging resistor may be fitted either in the cap of the automobile lamp or in an outer bulb of the lamp.

The invention offers very particular advantages in conjunction with high-pressure discharge lamps which do not contain mercury. Such lamps are particularly desirable for environmental protection reasons. They contain a suitable metal halide fill and, in particular, a noble gas such as xenon at a high pressure. Owing to the absence of mercury, the ignition voltage is particularly high. It is more than 20 kV. Currently, the components of the ignition unit are fitted in the cap. A spiral pulse generator having an integrated charging resistor may be fitted either in the cap of the mercury-free lamp or in an outer bulb of the lamp.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for producing a ceramic spiral pulse generator, the method comprising;
    providing a film composite comprising at least one ceramic green film and at least one metal layer;
    winding the film composite to form a spirally wound winding;
    laminating the winding; and
    sintering the laminated winding so as to create a spiral pulse generator,
    wherein the production of the film composite comprises:
    producing a ceramic green film;
    printing on the ceramic green film with a metallic paste; and
    cutting the printed ceramic green film.

2. The method for producing a ceramic spiral pulse generator as claimed in claim 1, wherein ceramic material systems with at least one of a high dielectric constant; high permeability; and a mixture of the two, are used for the production of the ceramic green film or the ceramic slurry.

3. The method for producing a ceramic spiral pulse generator as claimed in claim 1, wherein the winding the film composite and the laminating the winding are carried out in a single process step.

4. The method for producing a ceramic spiral pulse generator as claimed in claim 3, wherein the winding and laminating of the film composite is carried out by means of heated rollers, which generate a defined application pressure with a defined tension of the film.

5. The method for producing a ceramic spiral pulse generator as claimed in claim 1, wherein the ceramic green film is printed on with a metallic paste by a drawing method with a squeegee with a gap width of 10 µm-120 µm at a drawing speed of between 0.5 cm/s and 2.0 cm/s.

6. The method for producing a ceramic spiral pulse generator as claimed in claim 1, wherein the lamination of the winding is carried out by an isostatic pressing process with bath temperatures of from 30° C. to 80° C. and with a pressing time of between 5 and 15 minutes.

7. The method for producing a ceramic spiral pulse generator as claimed in claim 1, wherein the sintering of the laminated winding is carried out at 500° C.-600° C.

8. The method for producing a ceramic spiral pulse generator as claimed in claim 1, wherein the sintering of the laminated winding is carried out at 1250° C.-1450° C.

9. The method for producing a ceramic spiral pulse generator as claimed in claim 1, wherein the sintering of the laminated winding is carried out at 800° C.-900° C.

10. A spiral pulse generator which is produced by a method for producing a ceramic spiral pulse generator, the method comprising:
    providing a film composite comprising at least one ceramic green film and at least one metal layer;
    winding the film composite to form a spirally wound winding;
    laminating the winding; and
    sintering the laminated winding so as to create a spiral pulse generator,
    wherein the production of the film composite comprises:
    producing a ceramic green film;
    printing on the ceramic green film with a metallic paste; and
    cutting the printed ceramic green film.

11. A high-pressure discharge lamp, comprising:
    a discharge vessel, which is fitted in an outer bulb of the high-pressure discharge lamp and is held there by a frame;
    an ignition device which generates high-voltage pulses in the high-pressure discharge lamp being integrated in the high-pressure discharge lamp;
    wherein the ignition device is a spiral pulse generator, which is part of the frame and is fitted in the outer bulb of the high-pressure discharge lamp, the spiral pulse generator being produced by a method for producing a ceramic spiral pulse generator, the method comprising:
    providing a film composite comprising at least one ceramic green film and at least one metal layer; winding the film composite to form a spirally wound winding;
    laminating the winding; and
    sintering the laminated winding so as to create a spiral pulse generator.

12. A method for producing a ceramic spiral pulse generator, the method comprising:
    providing a film composite comprising at least one ceramic green film and at least one metal layer;
    winding the film composite to form a spirally wound winding;
    laminating the winding; and
    sintering the laminated winding so as to create a spiral pulse generator,
    wherein the production of the film composite comprises:
    producing a ceramic green film;
    printing on the ceramic green film with a metallic paste; and
    cutting the printed ceramic green film.

13. The method for producing a ceramic spiral pulse generator as claimed in claim 12, wherein the metal foil is an anodized aluminum foil.

14. The method for producing a ceramic spiral pulse generator as claimed in claim 12, wherein the metal foil is a molybdenum foil.

15. The method for producing a ceramic spiral pulse generator as claimed in claim 12, wherein the metal foil contains at least one of the metals in the group copper, nickel, steel, zinc.

16. A method for producing a ceramic spiral pulse generator, the method comprising:
    providing a film composite comprising at least one ceramic green film and at least one metal layer;
    winding the film composite to form a spirally wound winding;
    laminating the winding; and
    sintering the laminated winding so as to create a spiral pulse generator,
    wherein the production of the film composite comprises:
    coating a metal foil with a ceramic slurry; and
    drying the composite comprising the ceramic slurry and the metal foil.

17. The method for producing a ceramic spiral pulse generator as claimed in claim 16, wherein the coating is carried out by a dip coating method, in which the metal foil is immersed in a bath of ceramic slurry.

* * * * *